United States Patent
Yamada

[19]

[11] Patent Number: 6,075,397
[45] Date of Patent: Jun. 13, 2000

[54] SEMICONDUCTOR INTEGRATED CIRCUIT

[75] Inventor: Takashi Yamada, Tokyo, Japan

[73] Assignee: NEC Corporation, Tokyo, Japan

[21] Appl. No.: 09/178,829

[22] Filed: Oct. 26, 1998

[30] Foreign Application Priority Data

Oct. 24, 1997 [JP] Japan .................................. 9-310030

[51] Int. Cl.$^7$ ................................................. H03H 11/26
[52] U.S. Cl. ............................ 327/262; 327/264; 327/24; 327/144; 327/146
[58] Field of Search .................................. 327/262, 263, 327/264, 23, 24, 27, 144, 145, 146, 148, 150

[56] References Cited

U.S. PATENT DOCUMENTS

| | | | |
|---|---|---|---|
| 4,017,806 | 4/1977 | Rogers | 331/1 A |
| 5,047,733 | 9/1991 | Nonaka et al. | 331/14 |
| 5,304,954 | 4/1994 | Saito et al. | 331/1 A |
| 5,783,972 | 7/1998 | Nishikawa | 327/157 |
| 5,818,304 | 10/1998 | Hogeboom | 327/148 |

FOREIGN PATENT DOCUMENTS 8-223018  8/1996  Japan .

OTHER PUBLICATIONS by V. Von Kaenel et al., "A Voltage Reduction Technique for Battery–Operated Systems", *IEEE Journal Of Solid–State Circuits*, vol. 25, No. 25, Oct. 1990, pp. 1136–1140.

*Primary Examiner*—Tim Callahan
*Assistant Examiner*—An T. Luu
*Attorney, Agent, or Firm*—Young & Thompson

[57]  ABSTRACT

The present invention provides an technique for compensating a operation speed variation based on a principle that a circuit operation speed is adjusted by reflecting a delay time of an internal circuit itself that is an object of the operation speed fluctuation compensation.

An internal circuit (1 in FIG. 1) has a critical path with an output terminal pair that outputs the identical logical values till its each operation is finished, and data in a complementary signal format as soon as its each operation is finished. A logical gate (2 in FIG. 1) can detect its operation end by sensing the signal transition into a complementary signal format at the output terminal pair of the internal circuit.

9 Claims, 7 Drawing Sheets

SEMICONDUCTOR INTEGRATED CIRCUIT

BACKGROUND OF THE INVENTION

1. Field of the Invention

The present invention relates to a semiconductor integrated circuit and in particular, to a circuit capable of compensating an operation speed fluctuation.

2. Description of the Related Art

Conventionally, as disclosed in Vincent von Kaenel, Peter Macken, Marc G. r. Degrauwe, "A voltage Reduction Technique for Battery-Operated System", IEEE Journal of Solid State Circuits, vol. 25, No. 5, 1990, this type of technique for compensating a operation speed variation is used for compensating a circuit operation speed so as to be synchronized with an operation timing of an external clock when there is a device-parameter deviation or a device parameter change caused by an externally-supplied voltage and a temperature change due to heat dissipation.

FIG. 6 is a block diagram showing an example of conventional technique for compensating a operation speed variation.

Referring to FIG. 6, an internal voltage Vred is supplied to a power voltage terminal of an internal circuit 101 an to a voltage control oscillator 102.

The voltage control oscillator 102 outputs to a fixed N-divider 103 an oscillation frequency according to the voltage of the internal voltage Vred supplied.

The fixed N-divider 103 divides the high frequency inputted from the voltage control oscillator 102 by N (N is an integer) as an output signal to a phase comparator 104.

The phase comparator 104 compares the output frequency from the fixed N-divider 103 to an external clock frequency fin. If the clock frequency fin is higher, an Up signal is outputted to a charge pump 105, and if the fin is lower, a Down signal is outputted to a charge pump 105.

The charge pump 105, upon reception of the Up signal, increases a charge supply to a low-pass filter 106 at a following stage, and upon reception of the Down signal, decrease charge from the low-pass filter.

The low-pass filter 106 flattens the charge flow from the charge pump 105 for supplying a DC voltage Vred with little fluctuation to the internal circuit 101 and the voltage control oscillator 102.

That is, when an Up signal is supplied to the charge pump 105, the voltage Vred becomes higher, and when a Down signal is supplied, the voltage Vred becomes lower.

The internal circuit 101 as an ordinary logical circuit, operates at a higher speed as the internal voltage Vred supplied becomes higher, and at a lower speed as the internal voltage Vred becomes lower.

Moreover, the voltage control oscillator 102 outputs a higher frequency as the internal voltage Vred supplied becomes higher, and a lower frequency as the internal voltage Vred supplied becomes lower.

Consequently, even if there are device parameter deviations and an external supply voltage fluctuation or temperature change caused by heat of device, the internal voltage Vred is automatically controlled so that the output frequency of the voltage control oscillator 102 be just fin×N.

That is, if the output frequency of the voltage control oscillator 102 is designed to be fin×N for th internal voltage Vred at which the internal circuit 101 operates at a desired speed, irregularities of the operation speed of the internal circuit 101 can be compensated.

Next, explanation will given on the operation speed fluctuation compensation disclosed in Japanese Patent Publication (Unexamined) No. 8-223018. FIG. 7 is a block diagram showing an example of the device-deviation tolerance compensation technique disclosed in the aforementioned Publication.

Referring to FIG. 7, an internal circuit 201 and a delay circuit are supplied with a first internal voltage Vpp, a second internal voltage Vnn, a first well voltage Vpb, and a second well voltage Vbn.

The internal circuit 201 and the delay circuit 202 use the clock signal fin as an input signal and are operated by a power source voltage corresponding to a voltage difference between the first internal voltage Vpp and the second internal voltage Vnn. The internal circuit 201 and the delay circuit 202 are constituted by a plurality of logical gates consisting of P channel MOS (Metal-Oxide-Semiconductor) transistors using a first well voltage Vbp as a well voltage and N channel MOS transistors using a second well voltage Vbn as a well voltage.

The delay circuit 202 includes a plurality of basic gates (CMOS inverters) connected in a plurality of stages for generating an output signal in a predetermined time after the clock signal fin is inputted, so that the output signal is transmitted to a phase comparator 204.

The phase comparator 204 compares the clock signal fin to the output signal of the delay circuit 202. If phase of the clock fin is earlier, a Down signal is outputted from the phase comparator 204 to a charge pump 205, and if phase of the fin is later, an Up signal is outputted to the charge pump 205.

The charge pump 205, upon reception of the Up signal, increases a charge supply to a low-pass filter 206 of a following stage, and upon reception of the Down signal, decrease charge from the low-pass filter 206.

The low-pass filter 206 flattens the charge flow from the charge pump 205 so that a DC voltage Vpin with little fluctuation is supplied to a voltage converter 207.

The first voltage converter 207, following the input terminal voltage, generates an internal voltage Vpp from an external power voltage Vdd. For example, this circuit is a three-terminal regulator.

A difference between the first internal voltage Vpp and the second internal voltage Vnn is the power voltage. If the first internal voltage Vpp increases, the internal circuit 201 and the delay circuit 202 operate at a higher speed. On the contrary, if the first internal voltage Vpp is lowered, their operation speed is also lowered.

Moreover, most of the P channel MOS transistors have the first well voltage Vbp (fixed voltage) as their well terminal voltage and the first internal voltage Vpp as their source terminal voltage. Accordingly, if the first voltage Vpp is increased, a threshold voltage VthP of the P channel MOS transistors is lowered.

Thus, increase of the internal voltage Vpp results in a high-speed operation of the internal circuit 201 and the delay circuit 202, and lowering of VPP results in a low-speed operation of the internal circuit 201 and the delay circuit 202.

Consequently, even if there is device parameter deviation and an external voltage Vdd fluctuation or a temperature change, the internal voltage Vpp is automatically controlled so that a delay time from a clock input to the delay circuit 202 to an output of an output signal from the delay circuit 202 is equal to the clock cycle.

That is, if the semiconductor integrated circuit is designed in advance so that the delay time of the delay circuit 202 is equal to the delay time of the internal circuit 201, it is possible to compensate operation speed variations or fluctuations of the internal circuit 201.

In FIG. 7, the second internal voltage Vnn and the second well voltage Vbn are grounding voltage. However, it is also possible to provide a second voltage converter between the grounding voltage and the second internal voltage Vnn.

Here, if the second internal voltage Vnn is made to change, the threshold voltage VthN of the N channel transistors is changed. Accordingly, in comparison to the case when only the first voltage converter or controller 207 is controlled, a wide range is available for operation speed compensation of the internal circuit 201.

However, the aforementioned conventional technique for compensating a operation speed variation have problems described below.

(1) The first problem is that it is impossible to correctly compensate the operation speed of the internal circuit.

This is because of an assumption that an output frequency of a voltage control oscillator and a delay time of the delay circuit consisting of basic gates connected in a plurality of stages are considered as the operation speed of the internal circuit. There is a certain position correlation between the internal circuit speed and the output frequency of the voltage control oscillator or the delay time of the delay circuit using transistors arranged on a single chip. However, it is clear that different speeds are measured in principle. To design a circuit considering a difference of these operation speeds, it is necessary to anticipate an operation margin for them.

(2) The second problem is that it is especially difficult to apply the conventional technique to circuits including analog circuits or a large wiring delay in their critical paths, dominating a delay time from an input to an output of an entire chip.

That is, an operation speed can be estimated by output frequency of the voltage control oscillator or the delay time of the delay circuit reflects only fluctuations of the transistor characteristics.

In rough approximation, in a case when a transistor gate delay is dominant, if ON-current of transistors is decreased into half by a device-parameter deviation or a temperature change, then the delay time of the circuit approximately doubles.

However, in a circuit where a wiring delay is dominant or in an analog circuit handling a fine amplitude, the relationship between the ON-current of their transistors and the circuit delay time is not linear, because the circuit delay time is also affected by the variation of a wiring thickness and the little deviation of ON-current between adjacent transistors.

Accordingly, when applying the aforementioned conventional technique to a circuit as a critical path, including an analog circuit or a circuit in which a wiring delay is critical, the correlation between an operation speed of an internal circuit and an output frequency of a voltage control oscillator or a delay time of a delay circuit is considerably lowered, causing a fatal error.

As the design-rule becomes smaller, a wiring delay becomes more dominant in most circuits. This tendency is considered to be further accelerated, and there will be left almost no circuits which can apply the technique for compensating a operation speed variation.

(3) The third problem is that a delay circuit or a voltage control oscillator or a fixed N-divider require a considerable area and therefore application of the conventional technique for compensating a operation speed variation costs much.

The reason is as follows. In principle, the multi-stage connection of basic logical gates should have a delay time identical to that of an internal circuit critical path. Accordingly, as the internal circuit size increases, the number of stages is also increased.

The technique for compensating a operation speed variation has little merit to apply it unless it is applied to a comparatively large circuit in size. Consequently, the delay circuit can be large in many cases.

Moreover, the voltage control oscillator and the fixed N-divider also require a certain area although not so large as the delay circuit.

(4) The fourth problem is that the voltage control oscillator and the delay circuit consume a considerable power.

As has been described in the circuit operation using the conventional technique for compensating a operation speed variation, the voltage control oscillator is operated at the frequency of the external clock fin multiplied by N, except for the power consumption of the internal circuit. Accordingly, a great power is consumed.

The delay circuit has also a number of stages connected because of the aforementioned reason, where a signal transition occurs with each clock input. Accordingly, the power consumption cannot be small.

Moreover, the power supply to the voltage control oscillator and the power supply to the internal circuit are both realized by a single charge pump. Accordingly the output power required of the charge pump is also very large.

The aforementioned power consumption in itself is a loss because it does not contribute to the performance of the internal circuit.

SUMMARY OF THE INVENTION

It is therefore an object of the present invention to provide an operation speed compensation circuit which accurately reflects an operation speed of an internal circuit even if the critical path includes an analog circuit or a large wiring delay.

Another object of the present invention is to provide an operation speed compensation circuit without a large area.

Still another object of the present invention is to provide an operation speed compensation circuit without a large power consumption.

In order to achieve the aforementioned objects, the technique for compensating a operation speed variation according to the present invention is based on a principle that a circuit operation speed is adjusted by reflecting a delay time of an internal circuit itself that is an object of the operation speed compensation.

More specifically, the a technique for compensating a operation speed variation according to the present invention uses an internal circuit (denoted by 1 in FIG. 1) having an output terminal pair as a critical path that outputs the identical logical values before its operation is finished and data in complementary signal format as soon as its operation is finished and therefore a logical gate (denoted by 2 in FIG. 1.) can detect its operation end by sensing the signal transmission at the output terminal pair.

The present invention uses an internal circuit (1 in FIG. 1) having a pair of complementary output terminal that outputs the identical logical values till an operation end.

Next, at a clock rise, input data are fetched into the internal circuit, starting an operation including calculation.

When the operation is complete, an output data appears in the output terminal pair of the complementary output internal circuit with a complementary signal format.

A logical gate detects the transition into the complementary-state signal at the output terminals of the internal circuit, and then the output signal of the logical gate is compared to the clock, thus enabling to accurately reflect the operation speed of the internal circuit.

DESCRIPTION OF THE PREFERRED EMBODIMENTS

Description will now be directed to embodiments of the present invention with reference to the attached drawings.

Figure 1:
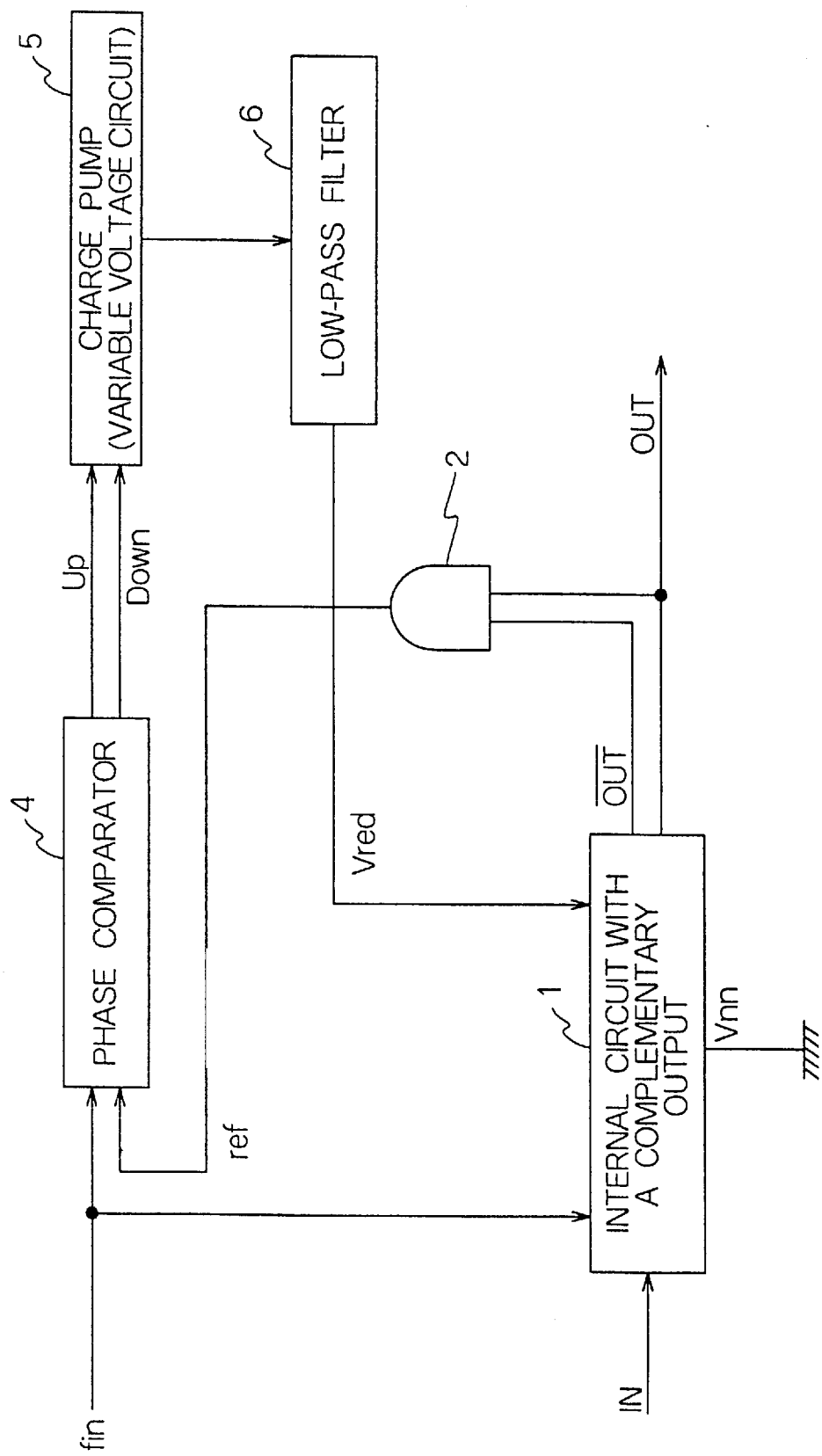
FIG. 1 is a block diagram showing a configuration of an operation speed compensation circuit according to a first embodiment of the present invention.

FIG. 1 is a block diagram showing a technique for compensating a operation speed variation according to a first embodiment of the present invention.

An internal circuit with a complementary output pair 1 has a power terminal and an N well terminal, and internal voltage Vred is supplied to each terminal.

Moreover, the internal circuit with a complementary output pair 1 has an input terminal IN through which data are inputted in synchronization with a rise of clock fin.

Here, this timing is defined to be T.

Furthermore, the internal circuit with a complementary output pair 1 has an output terminal pair OUT and OUT bar through which the identical logical values ("1" in this example) are outputted till its operation is finished. After the input data from the input terminal IN have been subjected to a predetermined calculation or processing, a complementary signal pair is outputted to the output terminal pair. That is, a logical value indicating the output data is fed to the OUT terminal, whereas a complement of the OUT is fed to the OUT bar terminal.

Here, the logical value of output ref of an AND gate 2 having input terminals; one is connected to the OUT terminal, and the other is connected to the OUT bar terminal is changed from "1" to "0".

The output ref of the AND gate 2 and the external clock fin are inputted to a phase comparator 4, where the fall timing of the clock fin after time T is compared to the fall timing of the ref.

When a phase of the ref is delayed than that of the clock fin, an Up signal is outputted to a charge pump 5 as a variable voltage circuit, and when the phase of the clock fin is delayed than that of the ref, a Down signal is outputted to the charge pump 5.

The charge pump 5 increases charge supply to a low-pass filter 6 upon reception of the Up signal, and decrease charge from the low-pass filter 6 upon reception of the Down signal.

The low-pass filter 6 flattens the charge flow from the charge pump 5 so as to obtain a DC voltage Vred with little fluctuation for supply to the internal circuit with a complementary output pair 1.

The internal circuit with a complementary output pair 1 increases its operation speed as the voltage Vred supplied becomes higher and decreases its operation speed as the Vred becomes lower.

Consequently, even if there is a device parameter deviation or an external supply voltage fluctuation or a temperature change, the internal circuit with a complementary output pair 1 operates at a speed to be in time for the timing of the clock fin, thus realizing the operation speed compensation.

It should be noted that until the fin rises next time after the time T, the internal circuit with a complementary output pair 1 is resetted to an initial state and accordingly, the logical value of the ref is resetted to "1".

The charge pump and the low-pass filter constituting a circuit for generating an internal power voltage according as outputs from the phase comparator may be replaced by a DC—DC converter such as a switching regulator.

Figure 2:
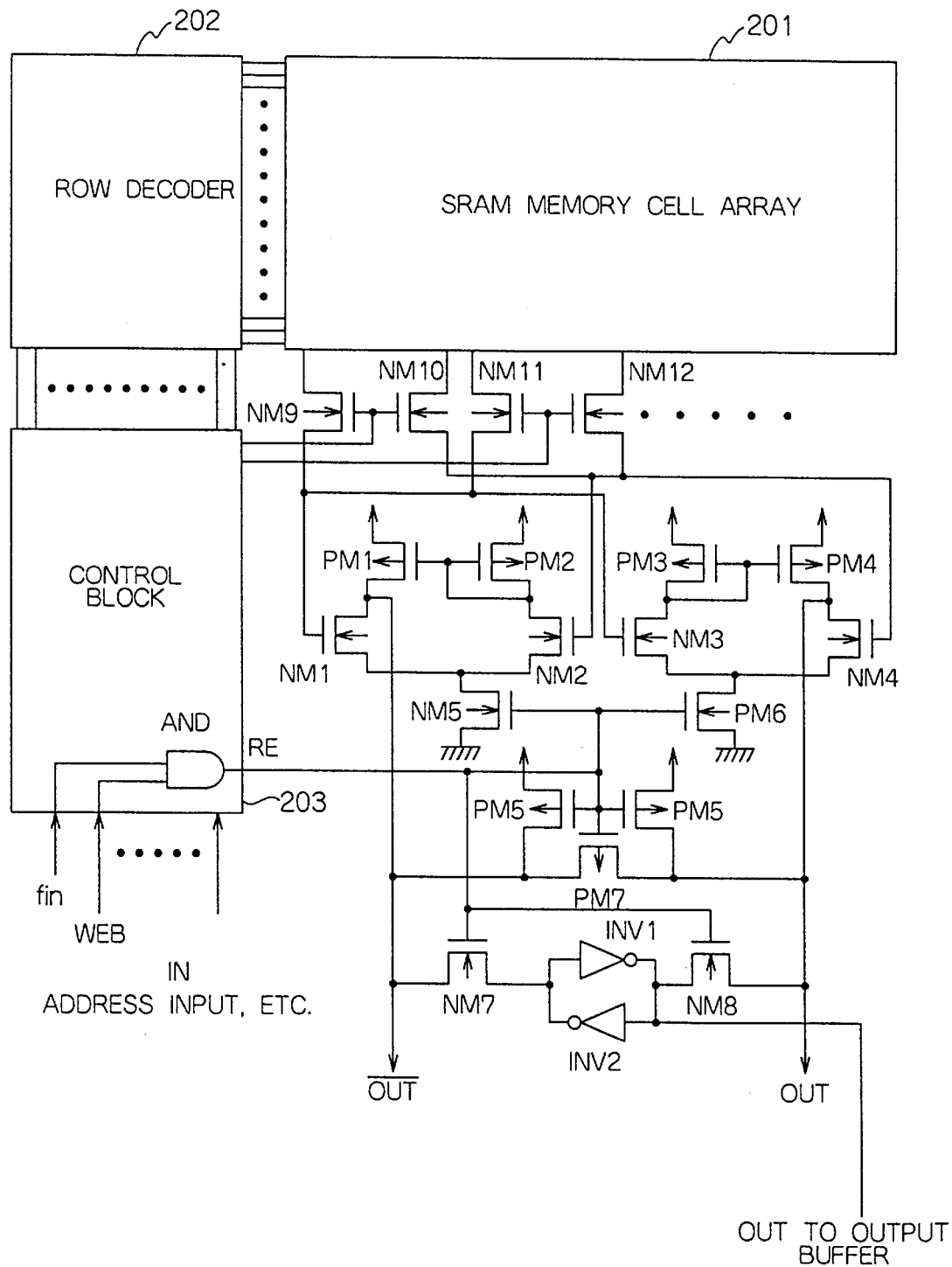
FIG. 2 is a block diagram showing a SRAM (static random access memory) as a configuration example of an internal circuit with a complementary outputs pair available to the operation speed compensation circuit according to the present invention.

FIG. 2 is a block diagram showing a SRAM (static random access memory) as a first example of the internal circuit with a complementary output pair 1.

This SRAM circuit is a typical SRAM circuit having the same configuration and operation with ordinary SRAM circuits. In general, a write operation is carried out at a higher speed than that in a read mode. Accordingly, in a write mode, there is no need to apply the technique for compensating the operation speed variation, according to the present invention.

Referring to FIG. 2, input terminals IN of a control block 11 consist of a input address line and a WEB signal line (write enable bar="0" in a write mode, and "1" in a read mode). A complementary output pair OUT terminal, OUT bar terminal is connected to an output pair of current mirror sense amplifiers arranged symmetrically. P-channel MOS transistors PM1, PM2 constitute a current mirror circuit and P-channel MOS transistors PM3, PM4 also constitute another current mirror circuit. These current mirror circuits serve as active loads for two differential circuits having constant current sources: N-channel MOS transistors NM5 and NM6 (their gate terminals are supplied with the RE signal).

When the clock fin is "0", an RE (read enable) is "0" and accordingly, "1" is outputted to both of the output terminals OUT and OUT bar, and the current mirror sense amplifiers are in an inactive state. That is, when the RE signal is "0" (low level), N-channel MOS transistors NM5 and NM6 (RE signal is inputted to the gate terminals) turn off. And both of the P-channel MOS transistors PM5 and PM6 turn on, and the output terminals OUT and OUT bar are both pulled up to "1" (high level).

In a read mode, at the rise of the clock fin, a row decoder 202 functions so that only one word line rises and one of the column selectors (transistors NM9, NM10, NM11, NM12, . . . ) 204 is selected for 1 bit.

Here, the RE signal immediately becomes "1" causing that the P-channel MOS transistors PM5, PM6, and PM7 turn off and the pull-up of the output terminals OUT and OUT bar is released. On the other hand, the constant current sources N-channel MOS transistors NM5 and NM6 of the differential circuits constituting the current mirror sense amplifiers both turn on, current mirror sense amplifiers get in an active state. Moreover, the N-channel MOS transistors NM7 and NM8 turn on so that the outputs of the current mirror sense amplifiers are electrically connected to a flip-flop (data latch) consisting of inverters INV1 and INV2 whose inputs and outputs are mutually connected.

Now, when the data from the selected memory cell pass through the column selector (for example, the transistors NM9, NM10 and the like in FIG. 2) to reach the inputs of the sense amplifiers, the current mirror sense amplifiers arranged symmetrically carry out amplification and a complementary signal pair of read-out data appears at the two outputs.

That is, the read-out data are fed to the data latch. At a same time, the output signal of the AND gate 2 (shown in FIG. 1) whose input terminals are connected to the output terminals OUT and OUT bar changes to "0".

This is the principle on which the circuits for compensating the operation speed variation according to the present invention accurately reflects the delay time of the critical path.

In actual SRAM circuits, a number of sense amplifiers corresponding to the number of bits operate simultaneously, where the sense amplifier which is provided at a farthest position from the row decoder is the critical path. Accordingly, the output pair of this farthest sense amplifier is made OUT and OUT bar shown in FIG. 1.

Figure 3:
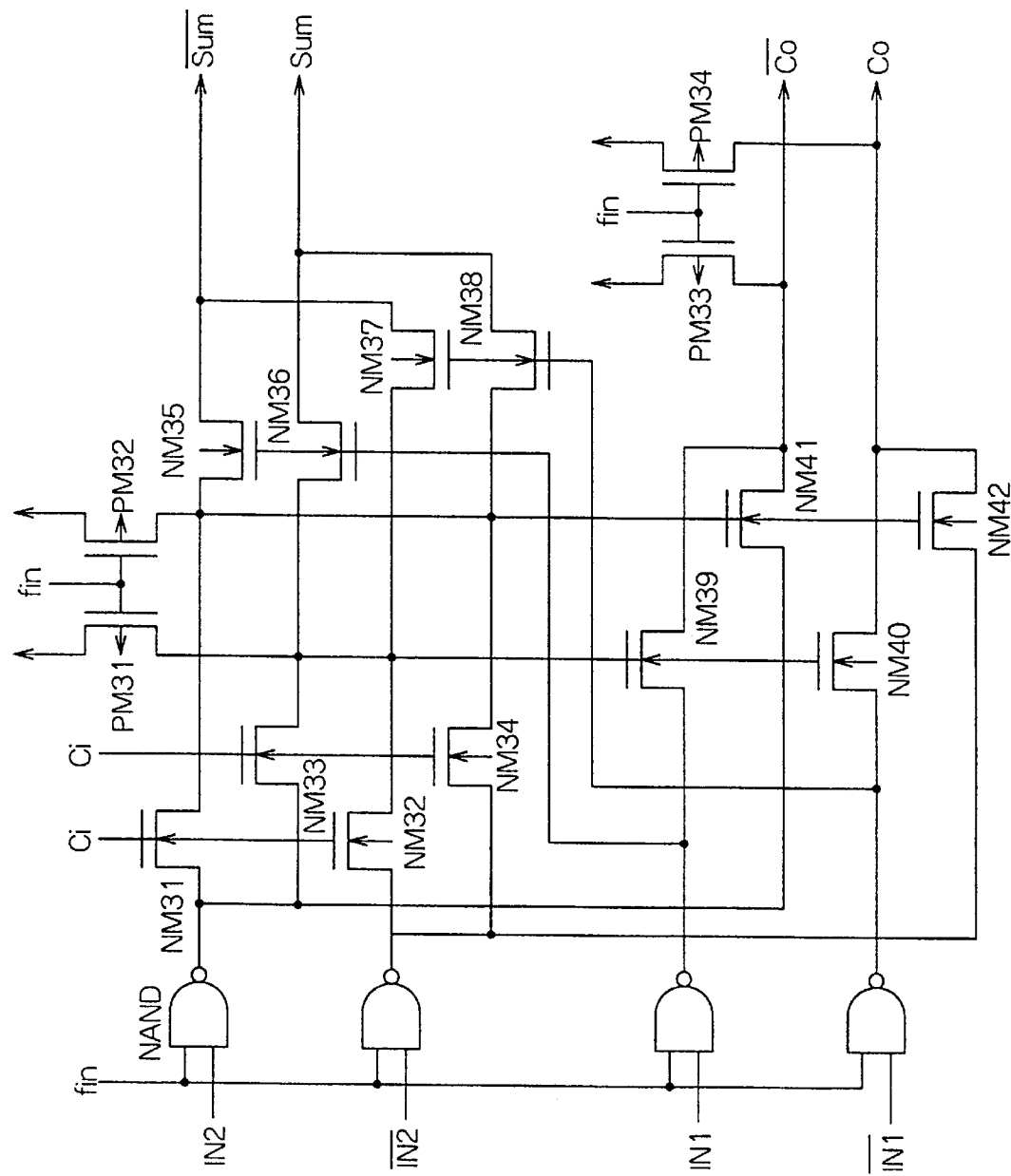
FIG. 3 is a block diagram showing a full adder as another configuration example of an internal circuit with a complementary outputs pair available to the operation speed compensation circuit according to the present invention.

FIG. 3 is a block diagram showing a configuration of a full adder as a second example of the internal circuit with a complementary output pair 1.

Referring to FIG. 3, this full adder operates in such a manner that when the clock fin is "0", all the internal terminals are logical "1", and if the clock fin rises, the full adder executes addition of the complementary input data IN1, IN1 bar, IN2, IN2 bar, and Ci, Ci bar which is a stepped-up input from a less significant digit and outputs the obtained sum to Sum, Sum bar and a stepped-up output to a more significant digit to Co, Co bar.

In this circuit, the Co, Co bar is the critical path until a complimentary signal is outputted. Accordingly, the Co and Co bar in FIG. 3 are connected to the OUT terminal and OUT bar terminal of FIG. 1.

In an actual multi-bit adder, a number of full adders are connected in columns and rows. With a combination of the full adder of FIG. 3, it is possible to apply the combination to the operation speed compensation circuit according to the present invention.

Figure 4:
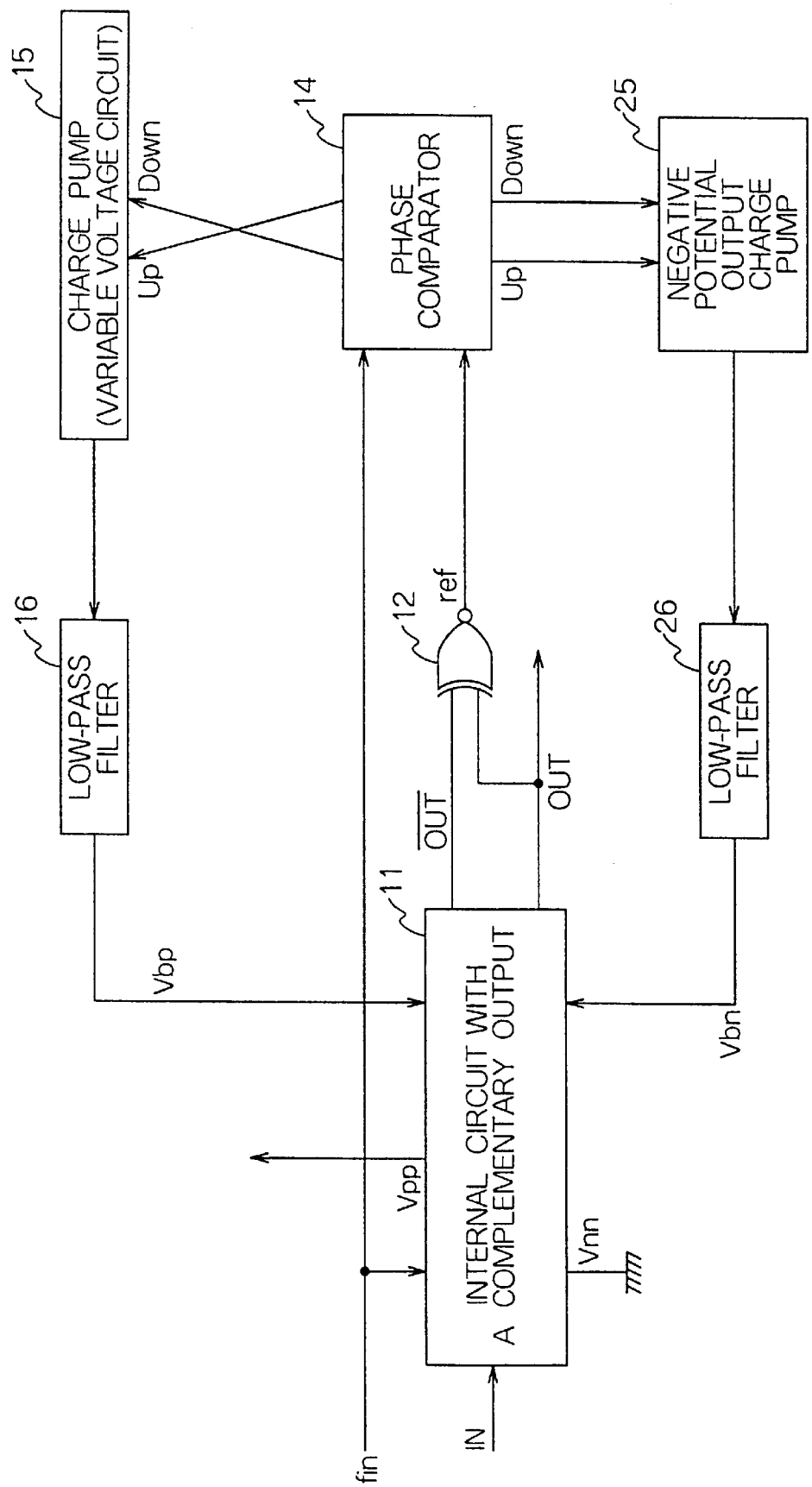
FIG. 4 is a block diagram showing a configuration of an operation speed compensation circuit according to a second embodiment of the present invention.

Description will now be directed to a second embodiment of the present invention. FIG. 4 is a block diagram showing a configuration of the second embodiment.

As has been described above in the a technique for compensating a operation speed variation according to the first embodiment of the present invention, the operation speed is compensated by adjusting the internal voltage Vred of the internal circuit with a complementary output pair 1.

In contrast to this, in the second embodiment of the present invention shown in FIG. 4, the operation speed variation is compensated by adjusting an N well voltage Vbp and a P well voltage Vbn of a internal circuit with a complementary output pair 11 constructed by a CMOS logical circuit.

As is well known, in a P-channel MOS transistor, when the N well voltage is lowered, the transistor threshold value VthP is lowered to increase the ON current, and in an N channel MOS transistor, when the P well voltage is increased, the transistor threshold value VthN is lowered to increase the ON current.

Thus, by adjusting the well voltage, it is possible to compensate the operation speed of the internal circuit with a complementary output pair 11.

More specifically, referring to FIG. 4, in the second embodiment of the present invention, outputs Up and Down from a phase comparator 14 are supplied to a charge pump 15 as well as to a negative voltage output charge pump 25.

The charge pump 15 has the same configuration and operation principle as the charge pump 5. However, because the Up and Down signal connection is reversed compared to FIG. 1. When the Up signal is fed, the N well voltage Vbp is lowered, and when the Down signal is fed, the Vbp is increased.

The negative voltage output charge pump 25 is a circuit for generating a voltage lower than the grounding voltage. When the Up signal is inputted from the phase comparator 14, the P well voltage Vbn is increased (approaching the grounding voltage), and when the Down signal is inputted, the Vbn is lowered.

Here, the charge pump 15 and the negative voltage output charge pump 25 simply supply a well voltage and accordingly, it is possible to significantly reduce the output current compared to the charge pump 5 in the first embodiment of FIG. 1. Consequently, it is possible to significantly reduce the area and power consumption of the charge pump.

Moreover, in the first embodiment shown in FIG. 1, the AND gate 2 is used as a logic gate detecting each operation end. However, as shown in FIG. 4, it is also possible to use an EXNOR (exclusive NOR) gate 12.

In this case, the logical values of the outputs OUT and OUT bar in a wait mode may be either "1" or "0" if they are same value.

Figure 5:
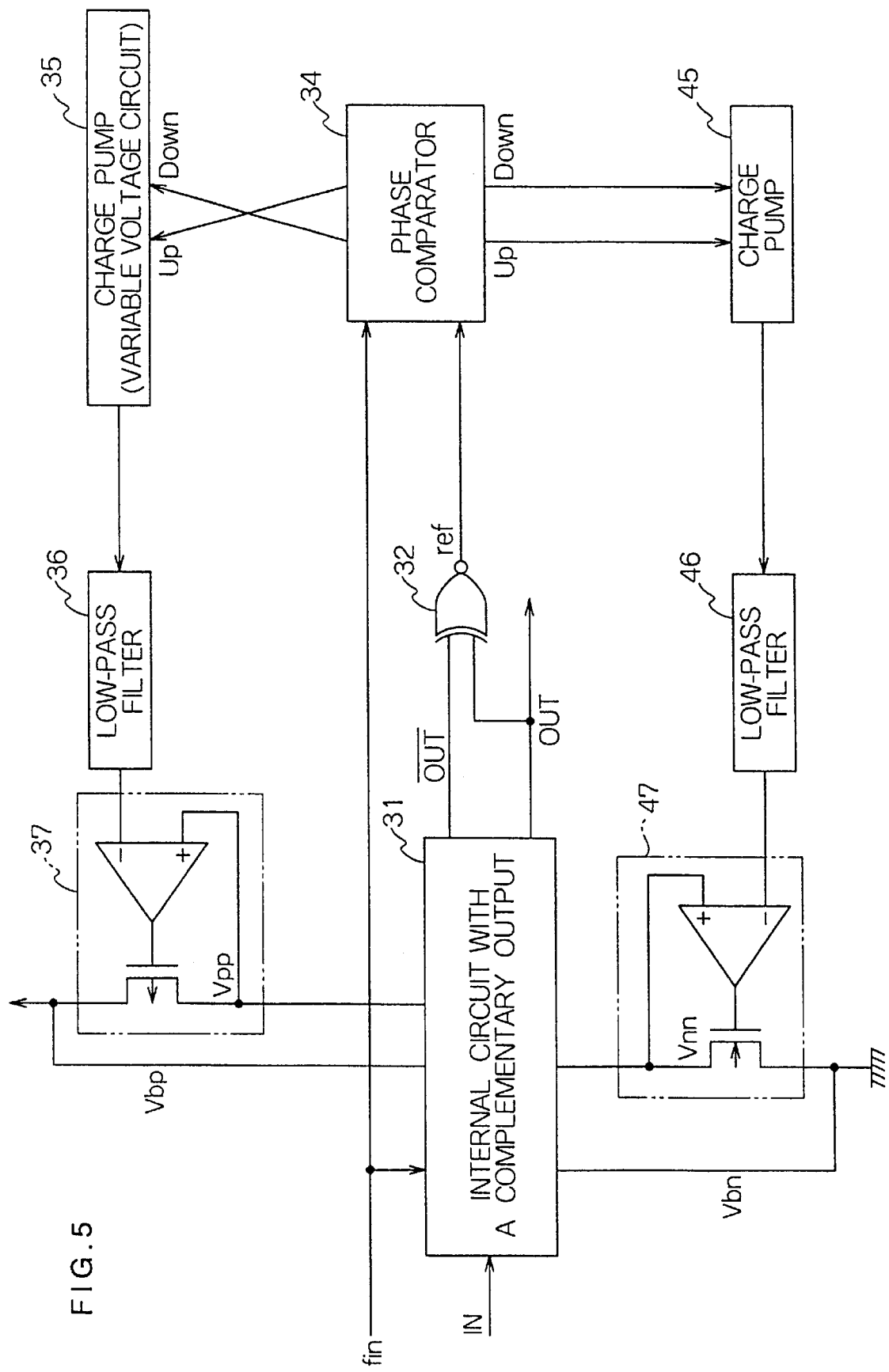
FIG. 5 is a block diagram showing a configuration of an operation speed compensation circuit according to a third embodiment of the present invention.
Figure 6:
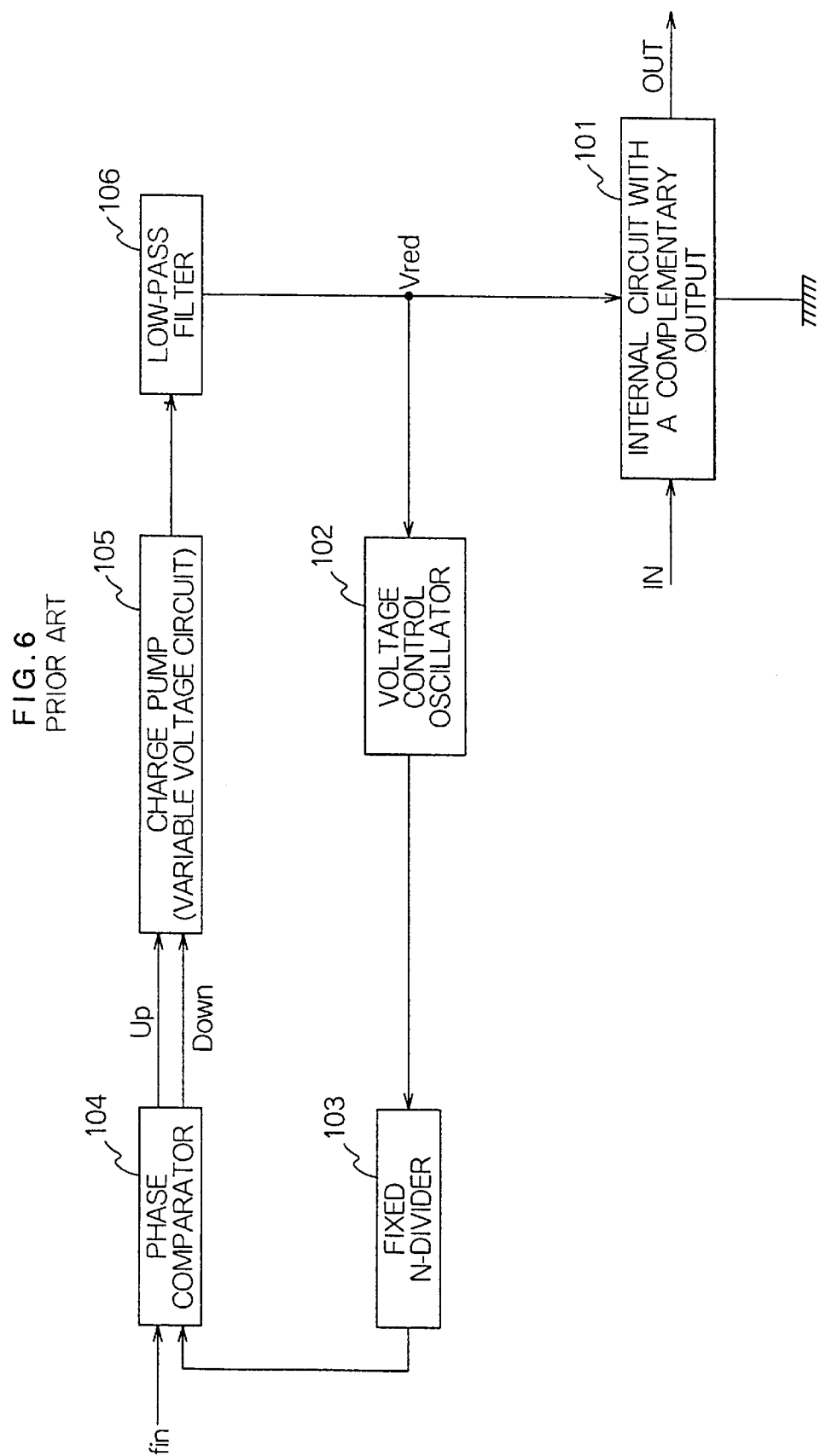
FIG. 6 is block diagram showing a configuration of a technique for compensating a operation speed variation.
Figure 7:
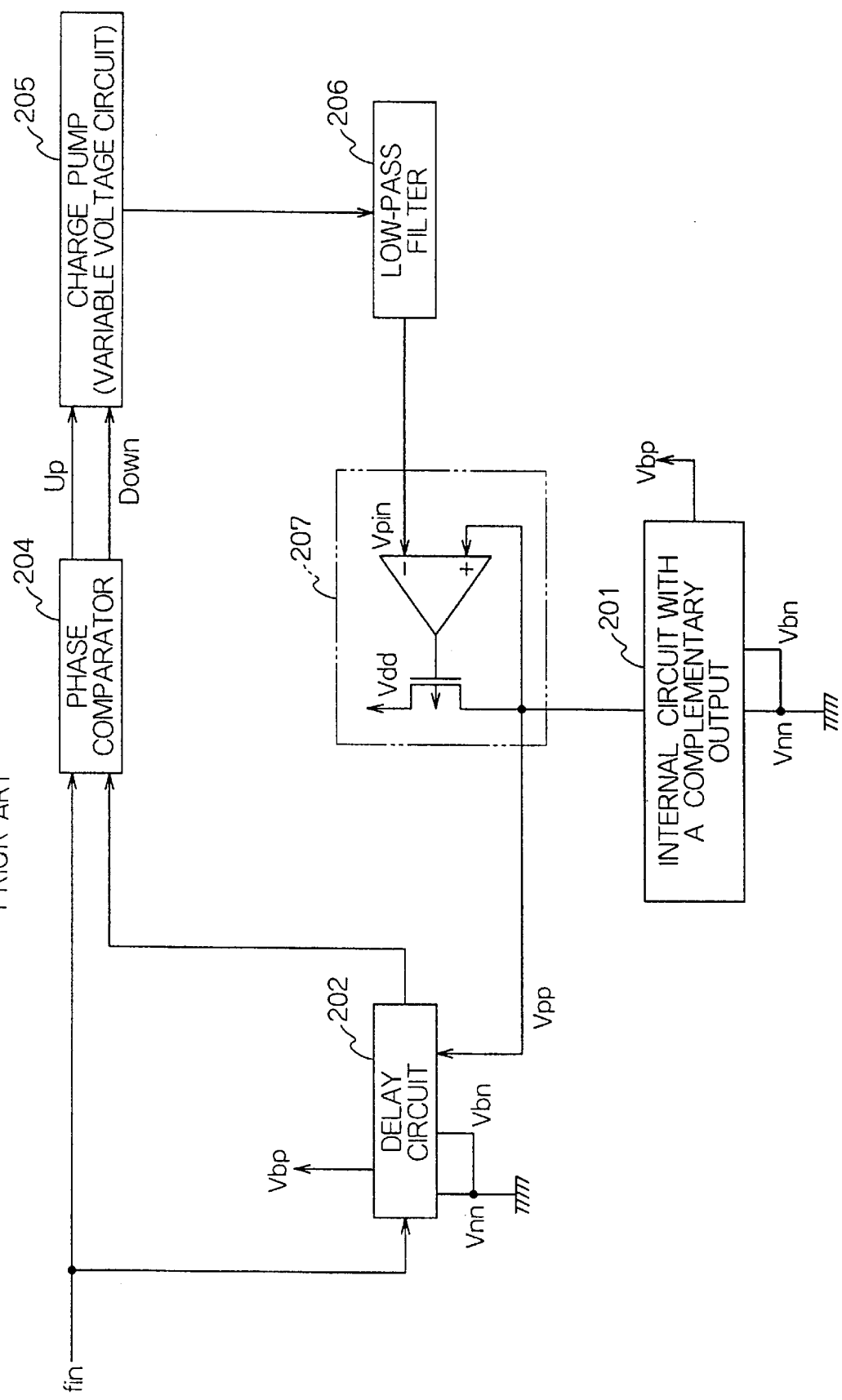
FIG. 7 is a block diagram showing a configuration of another conventional technique for compensating a operation speed variation.

Description will now be directed to the technique for compensating operation speed variation according a third embodiment of the present invention with reference to FIG. 5.

Referring to FIG. 5, in the third embodiment of the present invention, a internal circuit with a complementary output pair 31 constructed by a CMOS logical circuit with an N well terminal Vbp and a P well terminal Vbn which a respectively fixed to a power voltage and a grounding voltage. The operation speed variation is compensated by adjusting the power terminal Vpp and the grounding terminal Vnn of the internal circuit with a complementary output pair 31.

For the internal circuit with a complementary output pair 31, a voltage corresponding to a voltage difference between the power terminal Vpp and the grounding terminal Vnn is the substantial power source voltage.

Moreover, in the MOS transistors, the source voltage is adjusted with the well voltage fixed, which brings about fluctuation of the transistor threshold value.

With the aforementioned two effects, it is possible to compensate the operation speed of the internal circuit with a complementary output pair 31.

More specifically, referring to FIG. 5, in the third embodiment of the present invention, the outputs Up and Down from the phase comparator 34 are supplied to the first charge pump 35 and to a second charge pump 45.

The charge pumps 35 and 45 have a same configuration to the one used in FIG. 1 and operate in the same way. However, in the fist charge pump 35, connections of the Up signal and the Down signal are reversed. When the Up signal is inputted, the first low-pass filter 36 lowers its output voltage, and when the Down signal is inputted, the first low-pass filter 36 increases its output voltage.

The outputs of the charge pump 35 and the charge pump 45 are connected to the input terminals of the first and the second low-pass filters, respectively.

The output voltages of the first and the second low-pass filters 35 and 46 are flattened with little fluctuation and inputted to first and second voltage converters 37 and 47.

The first voltage converter 37 is a circuit that follows the input terminal voltage change to generate a first internal voltage Vpp from the external voltage such as a 3-terminal regulator.

The second voltage converter 47 is a circuit that follows the input terminal voltage to generate a first internal grounding voltage Vnn such as a 3-terminal regulator.

The first charge pump 35 and the second charge pump 45 only need to supply an input voltage to the first and the second voltage converters. In comparison to the charge pump in the first embodiment shown in FIG. 1, the output current quantity can be significantly reduced. Accordingly, it is possible to significantly reduce the charge pump area and power consumption.

As has been described above, according to the present invention, it is possible to obtain following effects.

The first effect obtained by the present invention is that the delay time of the internal circuit can be accurately reflected. Consequently, there is no need of providing a margin to spare in designing and it is possible to apply the technique for compensating a operation speed variation even to a circuit in which an analog circuit or a wiring delay is a critical path.

This is because, in the present invention, the delay time of the internal circuit itself is directly compared to the clock timing.

The second effect obtained by the present invention is that the necessary area can be small.

This is because, in the present invention, there is no need of providing a delay circuit or a voltage control oscillator for representing the delay time of the internal circuit.

The third effect obtained by the present invention is that it is possible to omit a delay circuit and a voltage control oscillator having a large power consumption.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 9-310030 (Filed on Oct. 24$^{th}$, 1997) including specification, claims, drawings and summary are incorporated herein by reference in its entirety.

What is claimed is:

1. A semiconductor integrated circuit comprising:
    a logical circuit for outputting output signals to an output terminal pair, the output signal being identical logical values until operation of said logical circuit is finished and logical values of a complementary logical format as soon as operation of said logical circuit is finished;
    an output transition detection circuit for detecting the signal transition of the output signals from said output terminal pair;
    a phase comparator for outputting a phase difference signal corresponding to a phase difference between a predetermined clock signal and an output signal from said output transition detection circuit; and
    a variable voltage circuit for outputting an outputting voltage which is changing according to said phase difference signal,
    wherein the output voltage of said variable voltage circuit is connected to a power terminal of said logical circuit.

2. A semiconductor integrated circuit as claimed in claim 1, said variable voltage circuit is a charge pump.

3. A semiconductor integrated circuit as claimed in claim 1, wherein a low-pass filter is provided between said variable voltage circuit and said power terminal of said logical circuit.

4. A semiconductor integrated circuit as claimed in claim 1, wherein said logical circuit consists of MOS (Metal-Oxide-Semiconductor) transistors and said variable voltage circuit is constituted by a first variable voltage circuit and a second variable voltage circuit,
    wherein an output of said first variable voltage circuit is connected to N well terminals of said logical circuit consisting of MOS transistors and an output of said second variable voltage circuit is connected to P well terminals of said logical circuit consisting of MOS transistors.

5. A semiconductor integrated circuit as claimed in claim 4, wherein said first variable voltage circuit and said second variable voltage circuit are constituted by charge pumps.

6. A semiconductor integrated circuit as claimed in claim 4, wherein a first low-pass filter circuit is provided between said first variable voltage circuit and said N well terminals of said logical circuit consisting of MOS transistors, and a second low-pass filter circuit is provided between said second variable voltage circuit and said P well terminals of said logical circuit consisting of MOS transistors.

7. A semiconductor integrated circuit as claimed in claim 6, said circuit further comprising a first voltage converter changing an output voltage according to an output signal from said first low-pass filter with respect to a higher power voltage node and a second voltage converter changing an output voltage according to an output signal from said second low-pass filter with respect to a lower power voltage node,
    wherein an output of said first voltage converter is connected to a higher power voltage terminal and an output of said second voltage converter is connected to a lower power voltage terminal, and
    N well terminals of said logical circuit is connected to said lower power voltage node.

8. A semiconductor integrated circuit as claimed in claim 1, wherein said variable voltage circuit is constituted by a DC—DC converter consisting of a switching regulator.

9. A semiconductor integrated circuit as claimed in claim 1, wherein said logical circuit, during an operation mode, fetches a predetermined data from input terminals in synchronization with a clock signal and outputs logical values of a complementary logical format to an output terminal pair as soon as its each operation is finished, even though the logical circuit outputs the identical logical values to said output terminal pair till its each operation is finished.

* * * * *